(12) United States Patent
Kondo et al.

(10) Patent No.: US 10,729,044 B2
(45) Date of Patent: Jul. 28, 2020

(54) ELECTRONIC DEVICE AND METHOD FOR DISPOSING ELECTROMAGNETIC INTERFERENCE SUPPRESSOR

(71) Applicant: TOKIN CORPORATION, Sendai-shi, Miyagi (JP)

(72) Inventors: Koichi Kondo, Sendai (JP); Toshiaki Oka, Sendai (JP); Masashi Ikeda, Sendai (JP); Toshiyuki Igarashi, Sendai (JP)

(73) Assignee: TOKIN CORPORATION, Miyagi (JP)

( * ) Notice: Subject to any disclaimer, the term of this patent is extended or adjusted under 35 U.S.C. 154(b) by 4 days.

(21) Appl. No.: 16/065,790

(22) PCT Filed: May 26, 2016

(86) PCT No.: PCT/JP2016/065542
§ 371 (c)(1),
(2) Date: Jun. 22, 2018

(87) PCT Pub. No.: WO2017/110113
PCT Pub. Date: Jun. 29, 2017

(65) Prior Publication Data
US 2019/0008079 A1    Jan. 3, 2019

(30) Foreign Application Priority Data
Dec. 25, 2015 (JP) .................. 2015-254001

(51) Int. Cl.
*H01L 23/552* (2006.01)
*H05K 9/00* (2006.01)
(Continued)

(52) U.S. Cl.
CPC ......... *H05K 9/0026* (2013.01); *H01L 23/552* (2013.01); *H05K 1/0216* (2013.01);
(Continued)

(58) Field of Classification Search
None
See application file for complete search history.

(56) References Cited

U.S. PATENT DOCUMENTS 5,341,274 A * 8/1994 Nakatani .............. H05K 1/0216
174/394
5,742,488 A   4/1998 Lonka et al.
(Continued)

FOREIGN PATENT DOCUMENTS

| CN | 101500400 A | 8/2009 |
| CN | 101902899 A | 12/2010 |

(Continued)

OTHER PUBLICATIONS

International Search Report (ISR) dated Aug. 9, 2016 issued in International Application No. PCT/JP2016/065542.
(Continued)

*Primary Examiner* — Xanthia C Cunningham
(74) *Attorney, Agent, or Firm* — Holtz, Holtz & Volek PC

(57) ABSTRACT

An electromagnetic interference suppressor is disposed so as to be effective for noise in a wide frequency band including a high frequency band. Provided is an electronic device including an electromagnetic interference suppressor; an interfering object configured to generate an electromagnetic wave; an interfered object to be affected by the electromagnetic wave; a substrate configured to mount thereon the interfering object and the interfered object; and the electromagnetic interference suppressor disposed in parallel to the substrate, and is disposed along only one of the interfering object and the interfered object. When an end portion of the interfering object opposed to the interfered object is defined as a first end portion, and an end portion of the interfered object opposed to the interfering object is defined as a second end portion, one end portion of the electromagnetic
(Continued)

interference suppressor is disposed between the first end portion and the second end portion.

12 Claims, 13 Drawing Sheets

(51) Int. Cl.
 *H05K 1/02* (2006.01)
 *H01L 23/053* (2006.01)
 *H05K 1/14* (2006.01)
(52) U.S. Cl.
 CPC .......... *H05K 9/0022* (2013.01); *H01L 23/053* (2013.01); *H05K 1/142* (2013.01); *H05K 2201/10371* (2013.01); *H05K 2201/10522* (2013.01)

(56) References Cited

U.S. PATENT DOCUMENTS

| | | | | |
|---|---|---|---|---|
| 9,781,819 | B2* | 10/2017 | Strader | H05K 1/0203 |
| 2005/0221638 | A1 | 10/2005 | Berberich | |
| 2009/0190321 | A1 | 7/2009 | Yamazaki et al. | |
| 2010/0139971 | A1 | 6/2010 | Kato et al. | |
| 2011/0085316 | A1* | 4/2011 | Myers | H05K 3/284 |
| | | | | 361/818 |
| 2011/0176279 | A1* | 7/2011 | Zhao | H01L 21/4878 |
| | | | | 361/720 |
| 2012/0120613 | A1 | 5/2012 | Kuwabara et al. | |
| 2013/0265722 | A1* | 10/2013 | Hill | G06F 1/203 |
| | | | | 361/707 |
| 2014/0055957 | A1* | 2/2014 | Yang | H05K 7/20472 |
| | | | | 361/720 |
| 2015/0043161 | A1* | 2/2015 | Nelson | G06F 1/206 |
| | | | | 361/679.54 |
| 2015/0282392 | A1* | 10/2015 | Liu | H05K 9/0024 |
| | | | | 361/707 |
| 2015/0334885 | A1 | 11/2015 | Tomonari et al. | |
| 2015/0382448 | A1* | 12/2015 | Pennathur | H05K 1/0203 |
| | | | | 361/679.54 |
| 2016/0013527 | A1* | 1/2016 | Rich | H01M 10/623 |
| | | | | 429/96 |
| 2016/0095266 | A1* | 3/2016 | Liu | H05K 9/0032 |
| | | | | 174/384 |
| 2016/0278202 | A1 | 9/2016 | Nakao | |
| 2016/0293554 | A1* | 10/2016 | Tan | H01L 23/5385 |

FOREIGN PATENT DOCUMENTS

| | | |
|---|---|---|
| CN | 102056448 A | 5/2011 |
| CN | 202014429 U | 10/2011 |
| CN | 102474987 A | 5/2012 |
| CN | 204632754 U | 9/2015 |
| JP | 05004592 U | 1/1993 |
| JP | H11354691 A | 12/1999 |
| JP | 2000196282 A | 7/2000 |
| JP | 2001268190 A * | 9/2001 |
| JP | 2001268190 A | 9/2001 |
| JP | 2001274582 A | 10/2001 |
| JP | 2002134679 A | 5/2002 |
| JP | 2002185408 A | 6/2002 |
| JP | 2005235944 A | 9/2005 |
| JP | 2006304080 A | 11/2006 |
| JP | 2010135701 A | 6/2010 |
| JP | 2011049807 A | 3/2011 |
| JP | 2013168439 A | 8/2013 |
| JP | 2014057040 A | 3/2014 |
| JP | 2015220260 A | 12/2015 |

OTHER PUBLICATIONS

Written Opinion dated Aug. 9, 2016 issued in International Application No. PCT/JP2016/065542.
Shigeyoshi Yoshida, et al., "Effects and Classification of Noise Suppression Sheets, and Performance Evaluation Method Therefor" (Special Issue: Noise Suppressing Soft-Magnetic Materials and Their Applications (Standards/Applications Edition)), EMC 20(7), pp. 35-46, Nov. 2007, Mimatsu Corp.
Chinese Office Action dated Jun. 26, 2019 (and English translation thereof) issued in counterpart Chinese Application No. 201680073519.X.
Japanese Office Action (and English language translation thereof) dated Sep. 11, 2019 issued in counterpart Japanese Application No. 2015-254001.

* cited by examiner

ELECTRONIC DEVICE AND METHOD FOR DISPOSING ELECTROMAGNETIC INTERFERENCE SUPPRESSOR

TECHNICAL FIELD

This invention relates to an electromagnetic interference suppressor, and more particularly, to disposition of the electromagnetic interference suppressor inside an electronic device.

BACKGROUND ART

There is a technology for disposing an electromagnetic interference suppressor along both of a part, a circuit, a conductive wire, and the like that generate noise (hereinafter collectively referred to as "interfering objects") and a part, a circuit, a conductive wire, and the like that may be affected by noise (hereinafter collectively referred to as "interfered objects") in order to suppress electromagnetic interference, in particular, internal interference (so-called autotoxication), occurring in various electronic devices. Electromagnetic interference against the interfered objects can be suppressed through disposition of an electromagnetic interference suppressor in this manner. "Electronic devices" used herein means devices including an electronic part, a circuit, wiring, and the like in general, and examples of the "electronic devices" include wireless communication terminals such as cellular phone terminals, and various computers such as desktop computers, laptop computers, and workstations.

Generally speaking, an electromagnetic interference suppressor is a sheet-shaped part in which magnetic powder is dispersed in a binding agent. The electromagnetic interference suppressor has a high electric resistance, and a frequency-selective loss characteristic resulting from magnetic resonance. Through disposition of the electromagnetic interference suppressor inside electronic equipment, the adverse effect of high frequency noise can be suppressed effectively without electromagnetic disturbance or other secondary side effects. At present, electromagnetic interference suppressors are rapidly becoming popular as an easy noise countermeasure part that "takes effect just by sticking." Electromagnetic interference suppressors are internationally standardized by IEC 62333.

In Patent Document 1, there is disclosed a technology for enhancing the effect of suppressing electromagnetic interference through disposition of an electromagnetic interference suppressor so that the electromagnetic interference suppressor is in close contact with electronic parts mounted on a substrate. The substrate and the electronic parts set on the substrate are covered with an electromagnetic shield film to be shielded against electromagnetic waves. This close contact of the electromagnetic interference suppressor with the electronic parts and others requires laborious steps to accomplish. In addition, the electronic parts disposed on the substrate and covered with the film together with the substrate cannot adapt to a change to the disposition of the electronic parts when the disposition of the electronic parts is to be changed for some reason or another.

Patent Document 2 includes a description about suppressing interference between electronic parts by attaching an electromagnetic radiation noise absorption sheet near the electronic parts. A point to be noted in Patent Document 2 is that the electromagnetic radiation noise absorption sheet is disposed along an interfering object and an interfered object each. Two electromagnetic radiation noise absorption sheets are illustrated in FIG. 1 of Patent Document 2, as well as in FIG. 2 of Patent Document 2.

According to Non Patent Document 1, main noise suppression functions of a noise suppression sheet, that is, an electromagnetic interference suppressor, are (1) suppression of coupling in the near field, (2) suppression of unnecessary radiation in a high frequency line, and (3) attenuation of a noise component propagated along a transmission line. The following four measurement methods are regulated by IEC 62333-2 to evaluate the main noise suppression functions.

(a) Intra-Decoupling Ratio: Rda

Rda is the proportion of attenuation obtained by attaching a noise suppression sheet in parallel to a transmission line, with respect to spatial coupling occurring between two transmission lines, or between two parts mounted to the same printed wiring board.

(b) Inter-Decoupling Ratio: Rde

Rde is the proportion of attenuation obtained by attaching the sheet in a gap between two transmission lines, between printed wiring boards, or between two parts, with respect to spatial coupling occurring between the transmission lines, between the printed wiring boards, or between the parts.

(c) Transmission Attenuation Power Ratio: Rtp

Rtp is the amount of attenuation obtained per unit line length by attaching the sheet in a transmission line, with respect to a conducted signal or noise propagated along the transmission line.

(d) Radiation Suppression Ratio: Rrs

Rrs is the amount of suppression obtained by attaching the sheet, with respect to radiation noise radiated from a circuit board. This measurement is far-field measurement by the same 10-m method or 3-m method that is used in normal EMI measurement.

PRIOR ART DOCUMENT(S)

Patent Document(s)

Patent Document 1: JP 2014-057040 A, paragraphs [0068] and [0088], and FIG. 2

Patent Document 2: JP 2000-196282 A, paragraphs [0008], [0012], [0013], [0017], and [0018], FIG. 1, and FIG. 2

Non Patent Document(s)

Non Patent Document 1: Shigeyoshi Yoshida, Shigeru Takeda: "Effects and Classification of Noise Suppression Sheets, and Performance Evaluation Method Therefor" (Special Issue: Noise Suppressing Soft-Magnetic Materials and Their Applications (Standards/Applications Edition)), EMC 20 (7), pp. 35-46, 2007-11, Mimatsu Corp.

SUMMARY OF THE INVENTION

Problem to be Solved by the Invention

The inventors of this invention have found out that the noise suppression effect of an electromagnetic interference suppressor is small in a certain frequency band. This is presumably because the relative highness of the permittivity of an electromagnetic interference suppressor in the in-plane direction leads to an increase in coupling due to an electric field induced in the in-plane direction, in other words, the intra-decoupling ratio of an electromagnetic interference suppressor is negative in that frequency band. Contrary to the past view that electromagnetic interference suppressors have no special side effects, a side effect has been found in which electromagnetic coupling between an interfering object and an interfered object increases depending on the frequency in some cases.

In Patent Document 1, one sheet of electromagnetic interference suppressor is disposed along an interfering object and an interfered object both. This method of disposition has a possibility of allowing an increase in electromagnetic coupling for the reason described above. In Patent Document 2, one sheet of electromagnetic interference suppressor is disposed along an interfering object and an interfered object each, two sheets in total. The electromagnetic radiation noise absorption sheets in Patent Document 2 are also stuck to a metal conductor plate, which is disposed so as to cover the extent of a transmission unit and a reception unit. The metal conductor plate accordingly has a possibility of causing noise reflection.

This invention has been made in view of the above, and an object of this invention is to provide a method of disposing an electromagnetic interference suppressor, which is effective for noise in a wide frequency band including a high frequency band, and an electronic device in which an electromagnetic interference suppressor is disposed by this method.

In order to accomplish the object, there is provided, as an aspect of the present invention, an electronic device, comprising an interfering object configured to generate an electromagnetic wave; an interfered object to be affected by the electromagnetic wave; a substrate configured to mount thereon the interfering object and the interfered object; and an electromagnetic interference suppressor, which is disposed in parallel to the substrate, and is disposed along only one of the interfering object and the interfered object, wherein, when an end portion of the interfering object, which is opposed to the interfered object, is defined as a first end portion, and an end portion of the interfered object, which is opposed to the interfering object, is defined as a second end portion, one end portion of the electromagnetic interference suppressor is disposed between the first end portion and the second end portion.

The electronic device may further comprise an insulator, which is disposed in parallel to the substrate, and is disposed along another one of the interfering object and the interfered object.

The electronic device may further comprise a housing, which encloses both of the interfering object and the interfered object, wherein the housing includes the electromagnetic interference suppressor and the insulator.

The electronic device may further comprise a conductor plate, which is disposed, when one of the interfering object and the interfered object is disposed along one surface of the electromagnetic interference suppressor, and is disposed along another surface of the electromagnetic interference suppressor.

Each of the interfering object and the interfered object may be any one of an electronic part, an electronic circuit, and wiring. In particular, in case of wiring, the interfering object may be a power supply line and the interfered object may be a signal line.

As a preferable example of the electronic device, a communication device is known.

As another aspect of the present invention, there is provided a method of disposing an electromagnetic interference suppressor in an electronic device, the electronic device including an interfering object configured to generate electromagnetic wave; an interfered object to be affected by the electromagnetic wave; a substrate configured to mount thereon the interfering object and the interfered object; and an electromagnetic interference suppressor, which is disposed in parallel to the substrate, and is disposed along only one of the interfering object and the interfered object, the method comprising disposing, when an end portion of the interfering object, which is opposed to the interfered object, is defined as a first end portion, and an end portion of the interfered object, which is opposed to the interfering object, is defined as a second end portion, one end portion of the electromagnetic interference suppressor between the first end portion and the second end portion.

Effect of the Invention

According to this invention, it is possible to provide the method of disposing an electromagnetic interference suppressor, which is effective for noise in a wide frequency band including a high frequency band, and the electronic device in which an electromagnetic interference suppressor is disposed by this method.

MODES FOR CARRYING OUT THE INVENTION

Figure 1:
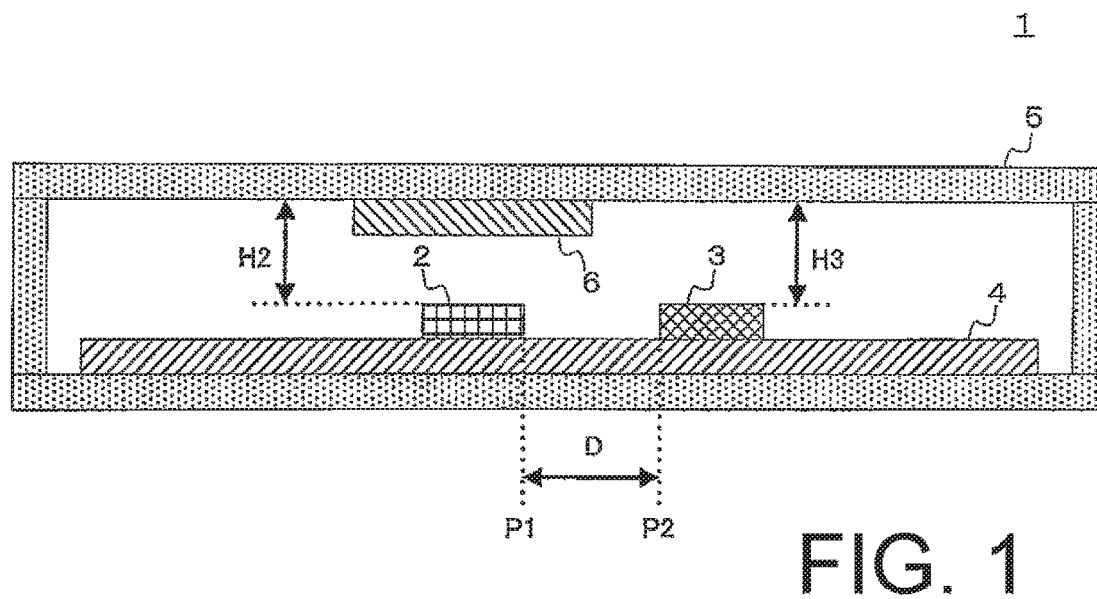
FIG. 1 is a schematic view for illustrating, in cross section, an electronic device 1 according to an embodiment of this invention, in which an electromagnetic interference suppressor 6 is disposed along an interfering object 2.

An electronic device 1 according to a first embodiment of this invention is described with reference to FIG. 1. The electronic device 1 includes an interfering object 2, an interfered object 3, a substrate 4, a housing 5, and an electromagnetic interference suppressor 6. The electronic device 1 is an electronic device of any type. The electronic device 1 is specifically a cellular phone terminal or a similar communication terminal device, a data communication device, or a personal computer, for example. However, the electronic device 1 is not limited thereto and can be any type of electronic device as long as the electronic device includes the interfering object 2 and the interfered object 3. The interfering object 2 is a part, a circuit, a device, wiring, or the like that may generate noise. The interfered object 3 is a part, a circuit, a device, wiring, or the like that may be affected by noise, and is typically an antenna. The interfering object 2 and the interfered object 3 are disposed on the substrate 4. The interfering object 2, the interfered object 3, and the substrate 4 are housed in the housing 5. The electromagnetic interference suppressor 6 is disposed inside the housing 5, in a place opposed to the interfering object 2. The housing 5 is made of, for example, plastic or a similar insulator.

The electronic device 1 may include, on the substrate 4, a part, a circuit, a device, and wiring other than the interfering object 2 and the interfered object 3. The electronic device 1 may include a part, a circuit, a device, and wiring other than the interfering object 2 and the interfered object 3 inside or outside the housing 5. The electromagnetic interference suppressor 6 is used mainly as a countermeasure against radiation noise and against internal interference (autotoxication) in small-sized digital equipment. The electromagnetic interference suppressor 6 can be a sheet-shaped part in which magnetic powder is dispersed in a binding agent, more specifically, a sheet-shaped part created by dispersing soft-magnetic metal powder in an insulating host material. The electromagnetic interference suppressor 6 may instead be a thick or thin film made from a high resistance magnetic material. The electromagnetic interference suppressor 6 may be a sheet having a simple rectangular shape, or may be a rectangular sheet with a slit in order to enhance the effect of suppressing electromagnetic interference.

The electromagnetic interference suppressor 6 is disposed along the interfering object 2. In other words, the electromagnetic interference suppressor 6 and a portion of the housing 5 are disposed along the interfering object 2. Note that one end of the electromagnetic interference suppressor 6 is positioned between the interfering object 2 and the interfered object 3, and falls short of an area above the interfered object 3. While a portion of the housing 5, namely, the insulator, is disposed along the area above the interfered object 3, the electromagnetic interference suppressor 6 is not disposed along the area above the interfered object 3. As illustrated in FIG. 1, an end portion of the interfering object 2 that is opposed to the interfered object 3 is referred to as "first end portion P1". An end portion of the interfered object 3 that is opposed to the interfering object is referred to as "second end portion P2". One end portion of the electromagnetic interference suppressor 6 is disposed between the first end portion P1 and the second end portion P2 in this case. A distance D is the distance between the first end portion P1 and the second end portion P2.

Through disposition of the electromagnetic interference suppressor 6 so as to cover only the space above the interfering object 2 and not the interfered object 3 in this manner, an electric field induced in the in-plane direction of the electromagnetic interference suppressor 6 (a horizontal direction in FIG. 1) can be severed at a point between the interfering object 2 and the interfered object 3. Electromagnetic interference can accordingly be suppressed in a wide frequency band while an increase in electromagnetic coupling between an interfering object and an interfered object, which is a side effect of the electromagnetic interference suppressor 6, is avoided.

Figure 2:
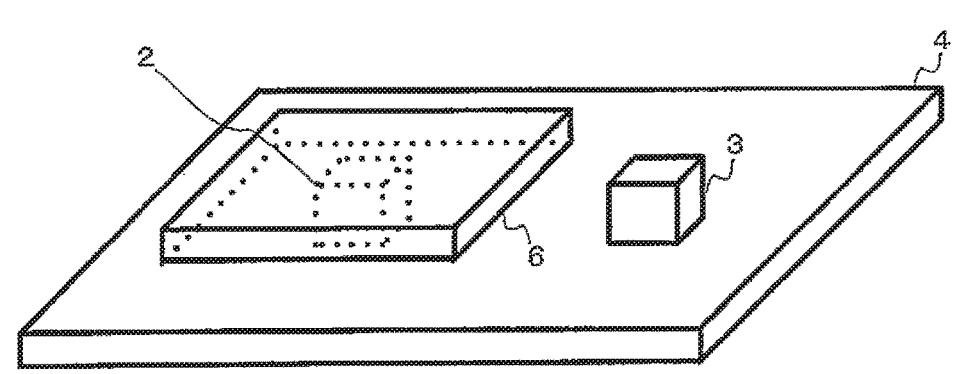
FIG. 2 is a perspective view for illustrating a positional relation among the interfering object 2, an interfered object 3, and the electromagnetic interference suppressor 6 in a housing 5 of the electronic device 1.

The positional relation among the interfering object 2, the interfered object 3, and the electromagnetic interference suppressor 6 is illustrated as a perspective view in FIG. 2. The housing 5 is omitted from FIG. 2. In FIG. 2, a Y-direction is a direction of a straight line corresponding to an extension of a line segment representing the distance D between the interfering object 2 and the interfered object 3. An X-direction is a direction orthogonal to the Y-direction in a horizontal plane of FIG. 2. A Z-direction is a direction orthogonal to the horizontal plane. The electromagnetic interference suppressor 6 covers the surrounding space of the interfering object 2 so as to cover the space along the entire perimeter of the interfering object 2 when viewed from the Z-direction, and so as to fall short of the area above the interfered object 3 with respect to the Y-direction.

The distance between a top surface of the interfering object 2 and an inner upper surface of the housing 5 is given as a distance H2. The distance between a top surface of the interfered object 3 and the inner upper surface of the housing 5 is given as a distance H3. The distances D, H2, and H3 in this case vary depending on the sizes of the electronic device 1, the interfering object 2, the interfered object 3, and others. When the electronic device 1 is a desktop personal computer (PC), for example, the distance D may be set to from 5 mm to 300 mm and the distances H2 and H3 are possibly set to from 1 mm to 5 mm. When the electronic device 1 is a cellular phone terminal or similar portable equipment, the distances D, H2, and H3 are possibly set to from ⅕ to ⅓ of the lengths given above as the distances D, H2, and H3 in a desktop PC.

Figure 3:
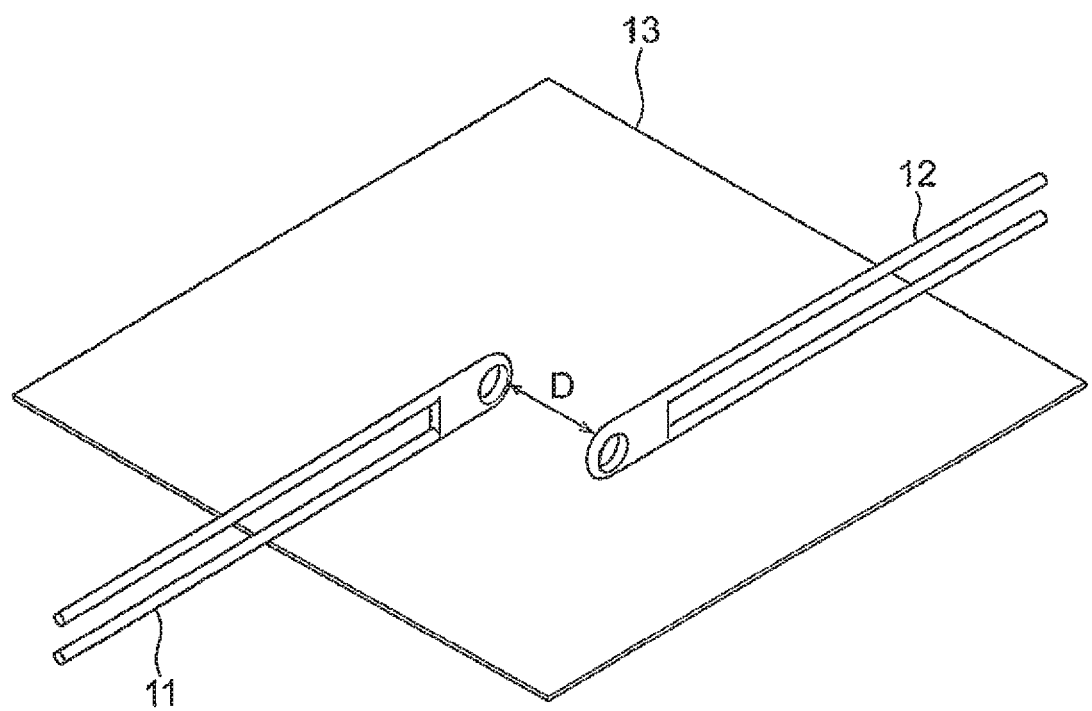
FIG. 3 is a perspective view for illustrating an evaluation system 10, which is created by modeling the electronic device 1.

An evaluation system 10 illustrated in FIG. 3 is modeled as an evaluation system simulating the electronic device 1. Intra-decoupling Rda in the evaluation system 10 has been calculated with the use of the high frequency three-dimensional electromagnetic field analysis software "ANSYS HFSS", a product of ANSYS Japan K.K. In the evaluation system 10, two antennas 11 and 12 are loop coils one of which corresponds to the interfering object 2 and the other of which corresponds to the interfered object 3. Coupling between the antennas 11 and 12 has been evaluated by connecting the antennas 11 and 12 to Port 1 and Port 2, respectively, of a network analyzer (not shown), based on transmittance characteristics S21 of the antennas 11 and 12. The intra-decoupling Rda, which is a parameter used in the evaluation, is an indicator indicating the degree of coupling between the antennas, and a larger value of Rda means weaker coupling. In other words, the propagation of noise is suppressed more by an electromagnetic interference suppressor 13 when the value of the intra-decoupling Rda is larger. The intra-decoupling Rda is calculated by the following expression:

$$Rda = S21R - S21M.$$

In the expression, S21R represents an S-parameter observed when the electromagnetic interference suppressor 13 is absent, and S21M represents the S-parameter observed when the electromagnetic interference suppressor 13 is present. The electromagnetic interference suppressor 13 corresponds to the electromagnetic interference suppressor 6. The electromagnetic interference suppressor 13 is obtained by flattening soft-magnetic metal powder whose composition includes 9.8% by mass of Si, 6.0% by mass of Al, and Fe, and dispersing the flattened powder in an elastomer excellent in powder filling properties. The electromagnetic interference suppressor 13 has a thickness of 0.2 mm. The antennas 11 and 12 each have a thickness of 1 mm. The distance between the antennas 11 and 12 corresponds to the distance D described above, and measures 10 mm.

Figure 4:
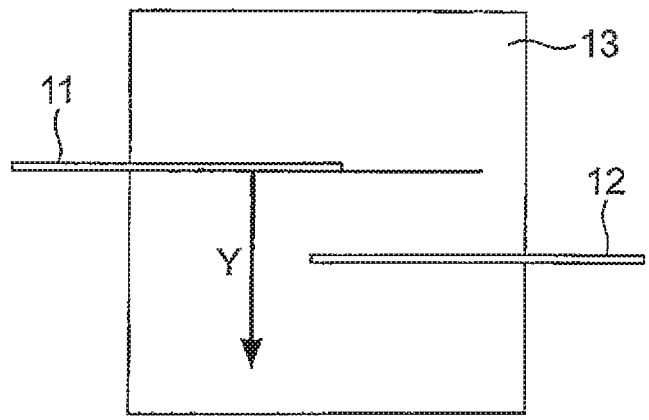
FIG. 4 is a plan view for illustrating a Y-coordinate in the evaluation system 10.
Figure 5:
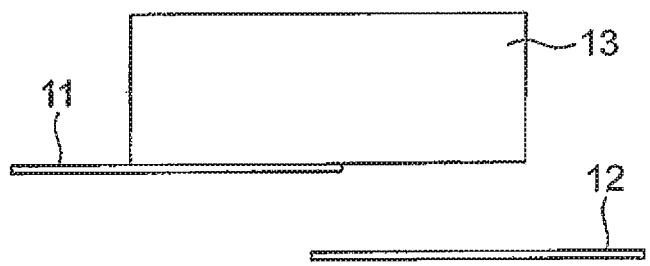
FIG. 5 is a plan view for illustrating how the evaluation system 10 looks when Y is −1 mm.
Figure 6:
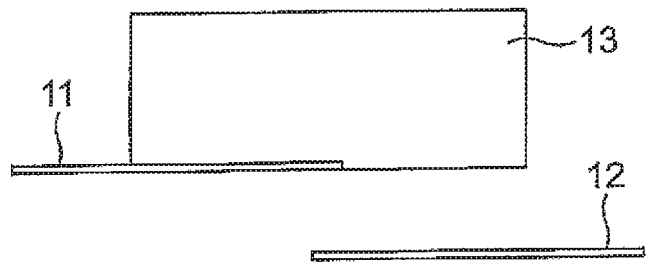
FIG. 6 is a plan view for illustrating how the evaluation system 10 looks when Y is 0 mm.
Figure 7:
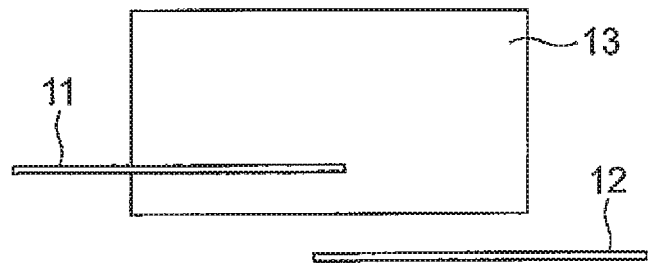
FIG. 7 is a plan view for illustrating how the evaluation system 10 looks when Y is 5 mm.
Figure 8:
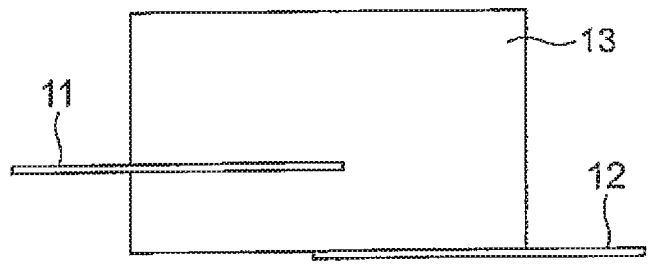
FIG. 8 is a plan view for illustrating how the evaluation system 10 looks when Y is 10 mm.
Figure 9:
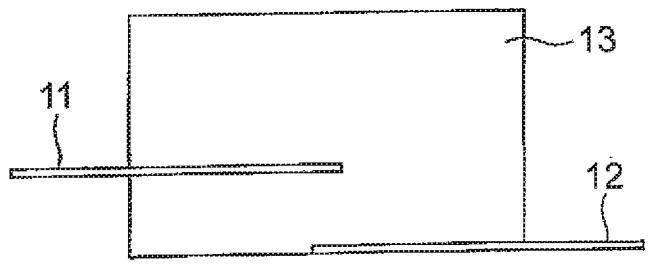
FIG. 9 is a plan view for illustrating how the evaluation system 10 looks when Y is 11 mm.
Figure 10:
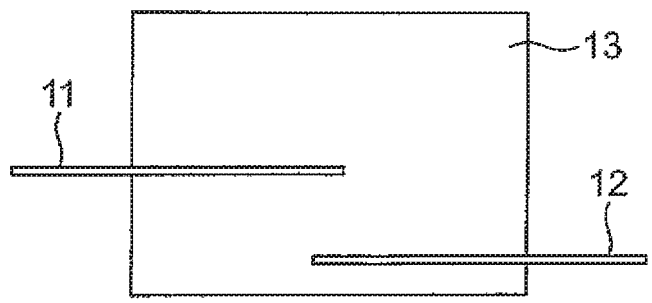
FIG. 10 is a plan view for illustrating how the evaluation system 10 looks when Y is 15 mm.
Figure 11:
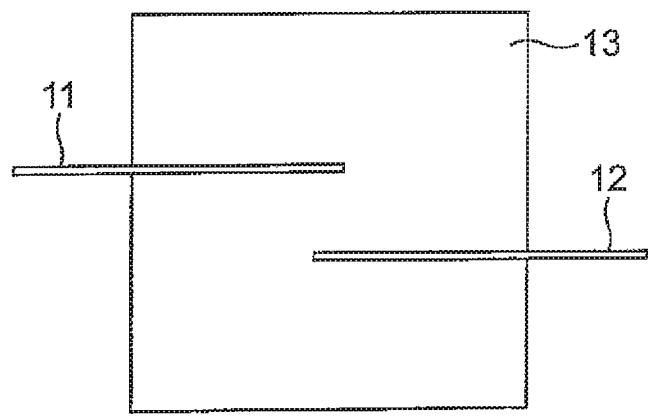
FIG. 11 is a plan view for illustrating how the evaluation system 10 looks when Y is 30 mm.

The position of the electromagnetic interference suppressor 13 is represented by Y. As illustrated in FIG. 4, Y is a coordinate along an axis that is a straight line running in a direction orthogonal to the antenna 11. The Y-coordinate is zero on one of two surfaces of the antenna 11 that is opposed to the antenna 12, and is positive in a direction approaching the antenna 12. Values to be read as the intra-decoupling Rda when the position Y of the electromagnetic interference suppressor 13 is −1 mm, 0 mm, 5 mm, 10 mm, 11 mm, 15 mm, and 30 mm are simulated here as illustrated in FIG. 5 to FIG. 11. This simulation works similarly for when the antenna 11 is the interfering object and when the antenna 12 is the interfering object.

Figure 12:
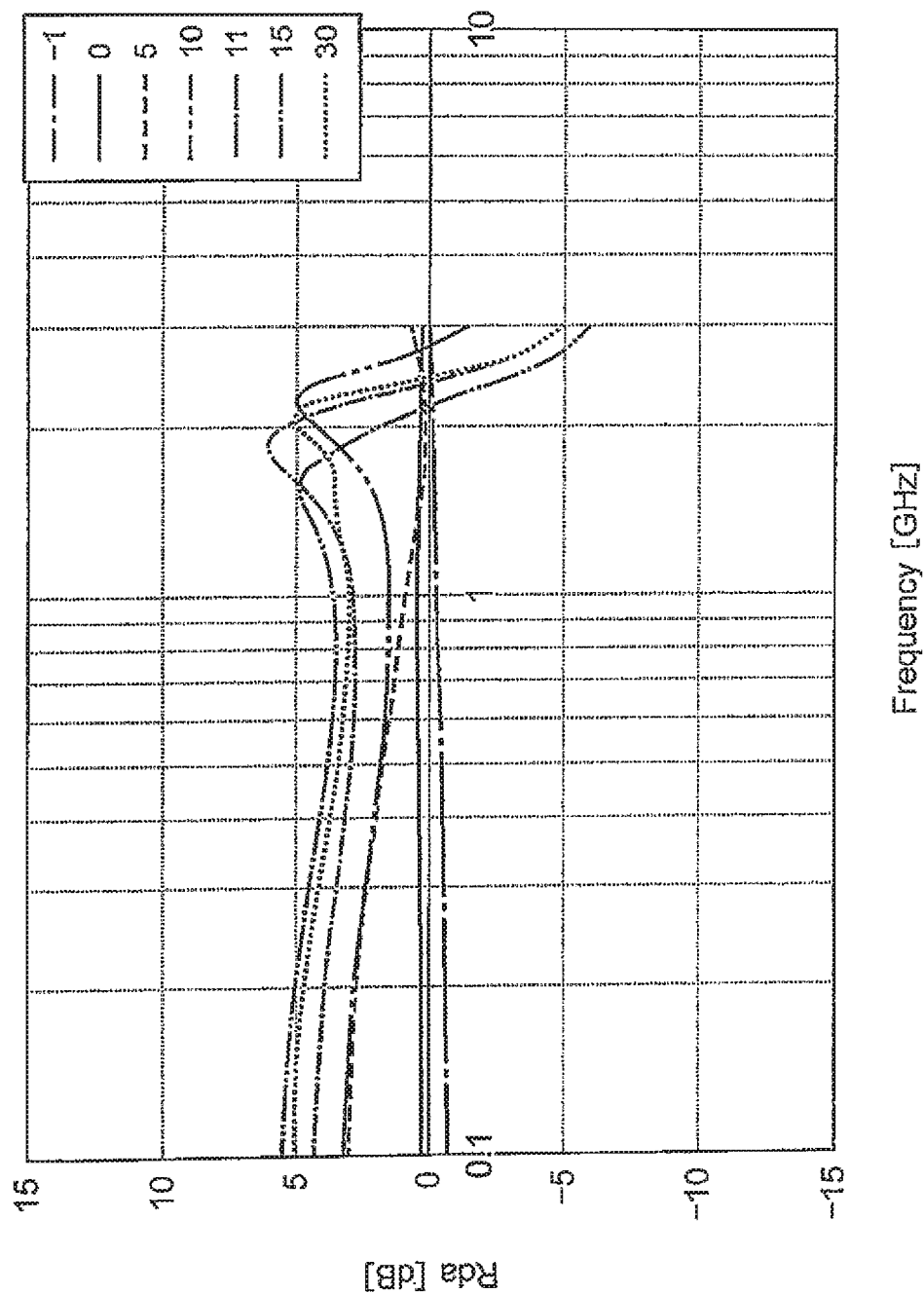
FIG. 12 is a graph for showing simulation results of intra-decoupling Rda in the evaluation system 10.

Simulation results of the intra-decoupling Rda are described with reference to FIG. 12.

When Y is −1 mm, that is, when the electromagnetic interference suppressor 13 covers only an area on the near side of the antenna 11 (an area above the antenna 11 in FIG. 5) and covers neither of the antennas 11 and 12, Rda is nearly equal to 0 and the electromagnetic interference suppressor 13 has substantially no effect.

When Y is 0 mm, that is, when the electromagnetic interference suppressor 13 covers the area on the near side of the antenna 11 and an area right above the antenna 11, Rda is positive throughout the entire frequency band for which the simulation has been conducted.

Figure 13:
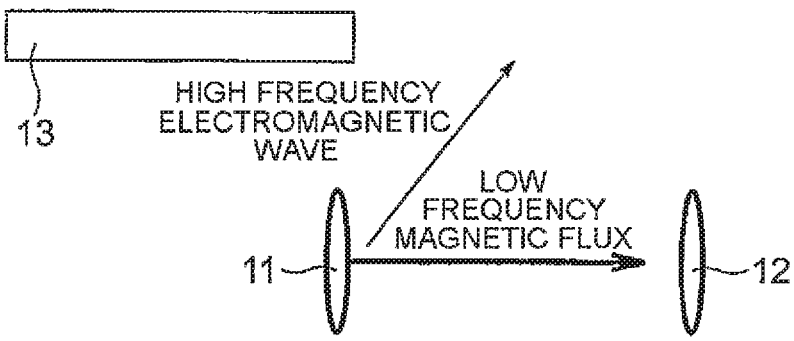
FIG. 13 is a diagram for illustrating how a low frequency magnetic flux and a high frequency electromagnetic wave are propagated in the evaluation system 10 when Y is 0 mm.

When Y is 0 mm, it is presumed that a low frequency magnetic flux generated by the interfering object travels straight to the interfered object without being converged by the electromagnetic interference suppressor as illustrated in FIG. 13. A high frequency electromagnetic wave generated by the interfering object, on the other hand, is presumed to be neither absorbed nor reflected by the electromagnetic interference suppressor.

When Y is 5 mm, that is, when the electromagnetic interference suppressor 13 covers the area right above the antenna 11 and an area stretching for a width of 5 mm from the antenna 11 in addition to the area on the near side of the antenna 11, Rda is positive throughout the entire frequency band for which the simulation has been conducted, and is greater than when Y is 0 mm, except in a range around 2 GHz.

Figure 14:
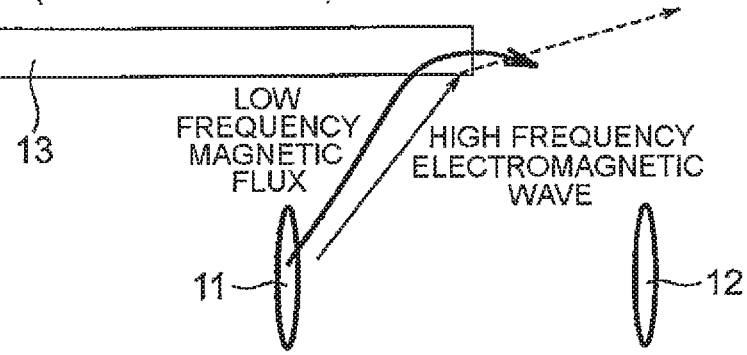
FIG. 14 is a diagram for illustrating how a low frequency magnetic flux and a high frequency electromagnetic wave are propagated in the evaluation system 10 when Y is 5 mm.

When Y is 5 mm, a low frequency magnetic flux generated by the interfering object is presumed to be converged by the electromagnetic interference suppressor as illustrated in FIG. 14. A high frequency electromagnetic wave generated by the interfering object is partially absorbed and partially reflected by the electromagnetic interference suppressor, and the reflected portion of the high frequency electromagnetic wave is presumed to travel in a direction deviating from the interfered object.

When Y is 10 mm, that is, when the electromagnetic interference suppressor 13 covers from the area on the near side of the antenna 11 to an area immediately preceding the antenna 12 (an area right above the antenna 12 is not included), Rda is greater than when Y is 5 mm until around 2.5 GHz. This is reversed around 2.5 GHz and, at 2.775 GHz, Rda passes 0 and turns negative. However, the drop of Rda in a high frequency range is small compared to cases described later in which Y is 11 mm, 15 mm, and 30 mm. The value of Rda at 3 GHz is 1.5 dB.

Figure 15:
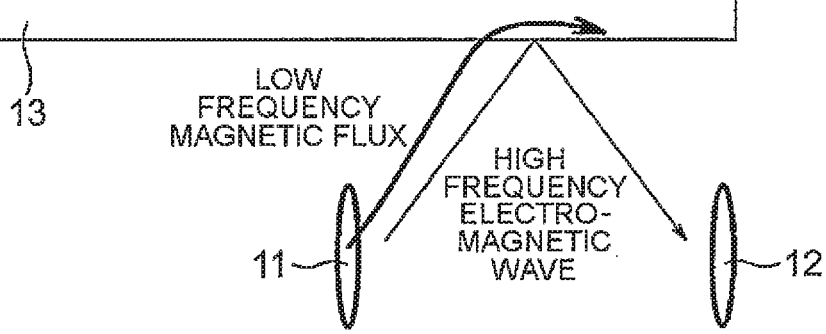
FIG. 15 is a diagram for illustrating how a low frequency magnetic flux and a high frequency electromagnetic wave are propagated in the evaluation system 10 when Y is 10 mm.

When Y is 10 mm, a low frequency magnetic flux generated by the interfering object is presumed to be converged by the electromagnetic interference suppressor as illustrated in FIG. 15. A high frequency electromagnetic wave generated by the interfering object is partially absorbed and partially reflected by the electromagnetic interference suppressor, and the reflected portion of the high frequency electromagnetic wave is presumed to be transmitted to the interfered object as well.

When Y is 11 mm, that is, when the electromagnetic interference suppressor 13 covers from the area on the near side of the antenna 11 to the area right above the antenna 12, Rda is positive until around 2.4 GHz, and is negative over 2.4 GHz. The value of Rda at 3 GHz is −5.0 dB.

When Y is 15 mm, that is, when the electromagnetic interference suppressor 13 covers the area on the near side of the antenna 11, past the area right above the antenna 12, and further covers a 4 mm-wide area, Rda turns from positive to negative around 2.16 GHz. The value of Rda at 3 GHz is −6.0 dB.

When Y is 30 mm, that is, when the electromagnetic interference suppressor 13 covers from the area on the near side of the antenna 11, past the area right above the antenna 12, and further covers a 19 mm-wide area, Rda turns from positive to negative around 2.43 GHz. The value of Rda at 3 GHz is −5.1 dB.

Figure 16:
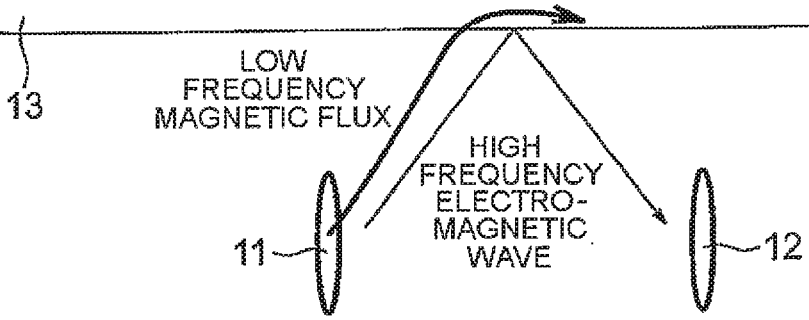
FIG. 16 is a diagram for illustrating how a low frequency magnetic flux and a high frequency electromagnetic wave are propagated in the evaluation system 10 when Y is 30 mm.

When Y is 30 mm, a low frequency magnetic flux generated by the interfering object is presumed to be converged by the electromagnetic interference suppressor as illustrated in FIG. 16, as in the case described above in which Y is 10 mm. A high frequency electromagnetic wave generated by the interfering object is partially absorbed and partially reflected by the electromagnetic interference suppressor. The reflected portion of the high frequency electromagnetic wave is presumed to be transmitted to the interfered object as well.

It is understood from the simulation results given above that a preferred value of Y is 0 mm to 10 mm in order to suppress the turning of the intra-decoupling Rda to negative, namely, an increase in electromagnetic coupling between the antennas 11 and 12. This translates into a state in which the coverage of the electromagnetic interference suppressor 13 extends past the antenna 11 and reaches the area immediately preceding the antenna 12.

A particularly preferred value of Y is equal to or more than 5 and equal to or less than 10 because, when Y satisfies 5≤Y≤10, a zone in which the intra-decoupling Rda is negative is small even in a frequency band equal to or higher than 2 GHz and a relatively large value of the intra-decoupling Rda is obtained even in a relatively low frequency band. A value of Y preferred when it is deemed important to ensure that the intra-decoupling Rda is positive throughout the entire frequency band including a frequency band equal to or higher than 2 GHz is 5 mm because then the intra-decoupling Rda has a large value.

The electronic device 1 is capable of suppressing electromagnetic interference from occurring inside the electronic device 1 over a wide frequency band. This facilitates speed enhancement and miniaturization of a built-in electronic circuit. The securing of communication quality is also facilitated when the electronic device 1 is a communication device.

Various modifications of the electronic device 1 are described below.

Figure 17:
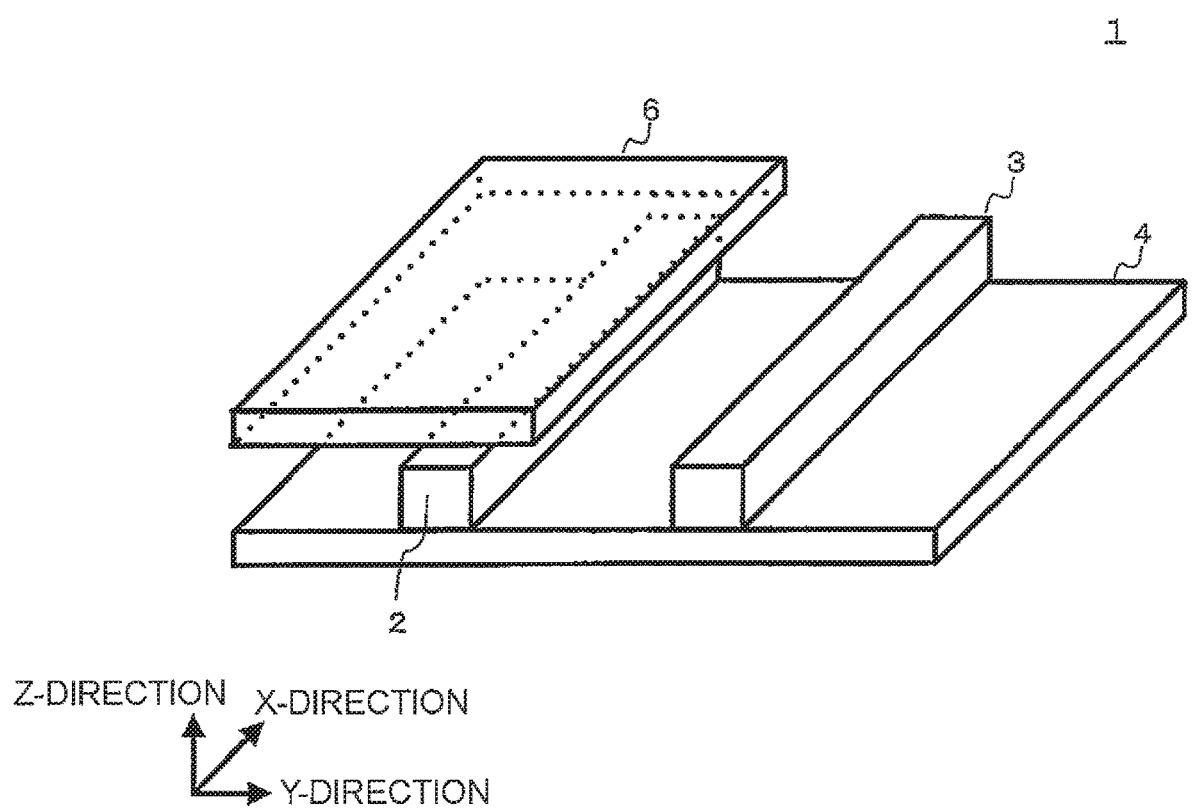
FIG. 17 is a perspective view for illustrating a positional relation observed between the interfering object 2, the interfered object 3, and the electromagnetic interference suppressor 6 in the housing 5 of the electronic device 1 when the interfering object 2 and the interfered object 3 are wiring.

The premise of FIG. 2 described above is that the interfering object 2 and the interfered object 3 are small-sized parts disposed on the substrate 4. However, the interfering object 2 and the interfered object 3 may be wiring. The disposition of the interfering object 2, the interfered object 3, and the electromagnetic interference suppressor 6 in this case is as illustrated in FIG. 17. Almost the exact description given above on the electronic device 1 applies to this case, which is apparent to a person skilled in the art.

Figure 18:
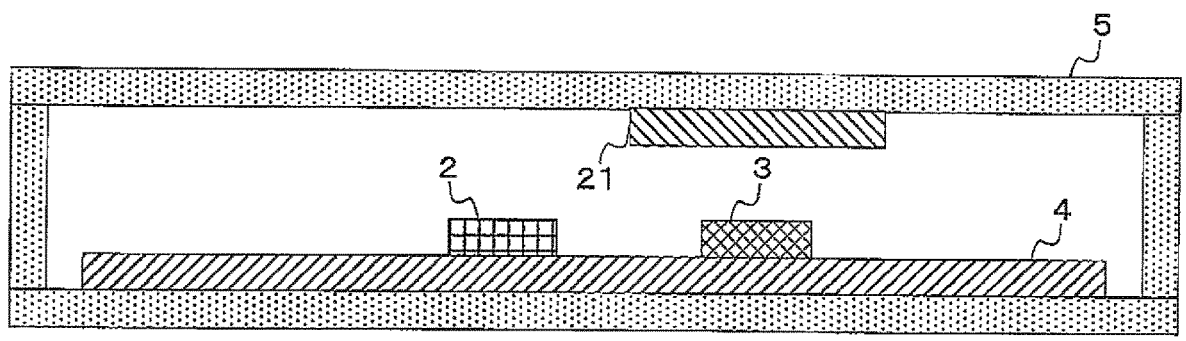
FIG. 18 is a schematic view for illustrating, in cross section, an electronic device 20, in which an electromagnetic interference suppressor 21 is disposed along the interfered object 3.

An electronic device 20 is described with reference to FIG. 18. The electronic device 20 differs from the electronic device 1 in the position of an electromagnetic interference suppressor 21. The electromagnetic interference suppressor 21 in the electronic device 20 is disposed so as to cover the space above the interfered object 3, whereas the electromagnetic interference suppressor 6 in the electronic device 1 is disposed so as to cover the space above the interfering object 2. No electromagnetic interference suppressor is disposed above the interfering object 2 in the electronic device 20.

The electromagnetic interference suppressor in this invention is disposed so as to cover the space above only one of the interfering object 2 and the interfered object 3 in order to prevent a high frequency electromagnetic wave reflected by the electromagnetic interference suppressor from reaching the interfered object 3. The electromagnetic interference suppressor may be disposed so as to cover the space above the interfering object 2 as in the electronic device 1, or may be disposed so as to cover the space above only the interfered object 3 as in the electronic device 20. Modification examples described below deal with the disposition of the electromagnetic interference suppressor in which the electromagnetic interference suppressor covers the space above only one of the interfering object and the interfered object. With regard to the effect of preventing an adverse effect of a high frequency electromagnetic wave reflected by the electromagnetic interference suppressor, however, the same level of effect is obtained also when the space above only the other of the interfering object and the interfered object is covered.

Figure 19:
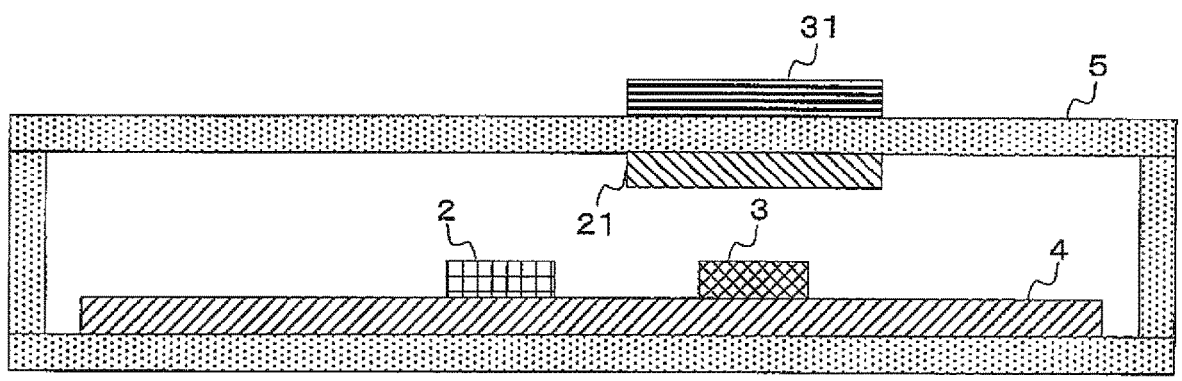
FIG. 19 is a schematic view for illustrating, in cross section, an electronic device 30, which includes an electromagnetic interference suppressor 21 disposed along an inner surface of the housing 5 and a conductor plate 31 disposed along an outer surface of the housing 5 so as to be opposed to the electromagnetic interference suppressor 21.

An electronic device 30 of FIG. 19 includes an electromagnetic interference suppressor 21 disposed along an inner surface of the housing 5, and further includes a conductor plate 31, which is disposed along an outer surface of the housing 5 so as to be opposed to the electromagnetic interference suppressor 21. The conductor plate 31 is disposed so as to hide behind the electromagnetic interference suppressor 21 when viewed from the interfered object 3. For that reason, the bottom surface of the conductor plate 31 is sized to be the same as or smaller than the bottom surface of the electromagnetic interference suppressor 21. The conductor plate 31 functions as an electromagnetic shield against an electromagnetic wave arriving at the interfered object 3 from the outside of the housing 5. The conductor plate 31, which is disposed on the housing 5 in the electronic device 30, may be disposed so as to be embedded in an opening formed in the housing 5, in a place corresponding to the back surface of the electromagnetic interference suppressor 21. A smaller conductor plate 31 is desirable from the viewpoint of preventing noise transmission caused by reflection.

Figure 20:
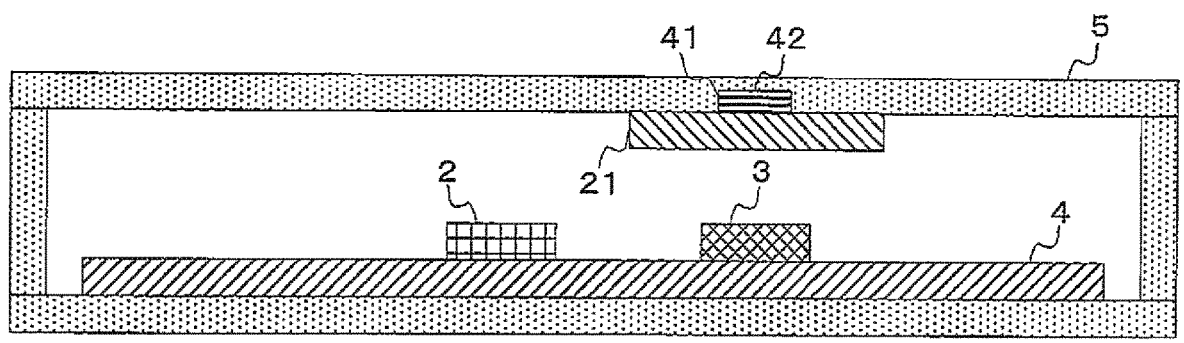
FIG. 20 is a schematic view for illustrating, in cross section, an electronic device 40, which includes the electromagnetic interference suppressor 21 disposed along an inner surface of the housing 5 and an antenna 42 disposed along a surface of the electromagnetic interference suppressor 21 on the housing 5 side.

An electronic device 40 of FIG. 20 includes a recess 41 formed in the housing 5, in a place corresponding to the back surface of the electromagnetic interference suppressor 21, to dispose an antenna 42 in the recess 41. The electronic device 40 is a cellular phone terminal or a similar wireless communication terminal, and the antenna 42 is an antenna for wireless communication.

Figure 21:
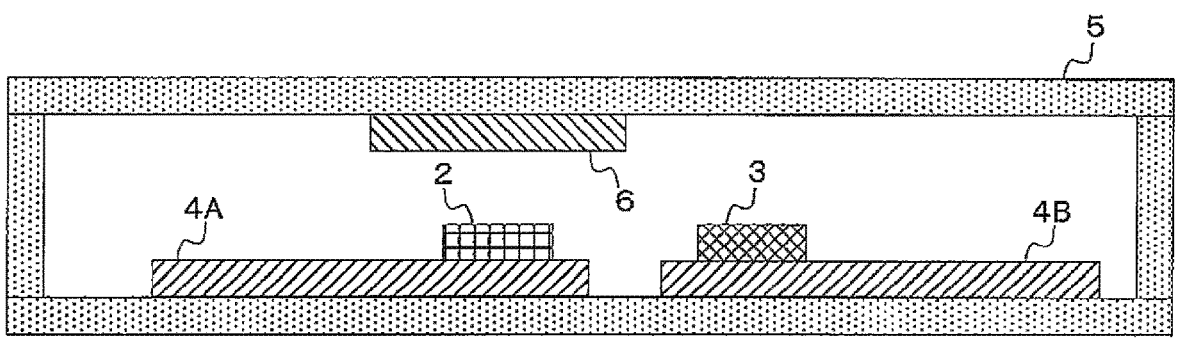
FIG. 21 is a schematic view for illustrating, in cross section, an electronic device 50, which includes separate substrates 4A and 4B, with the interfering object 2 disposed on the substrate 4A and the interfered object 3 disposed on the substrate 4B.

An electronic device 50 of FIG. 21 has two substrates 4A and 4B, instead of one substrate 4 in the electronic device 1. The interfering object 2 and the interfered object 3 are disposed on the substrate 4A and the substrate 4B, respectively. The interfering object 2 and the interfered object 3 are thus not always required to be disposed on the same substrate, and this invention works also when the interfering object 2 and the interfered object 3 are disposed on different substrates.

In the descriptions given above on the electronic device 1 and on the electronic devices 20, 30, 40, and 50, which are modifications of the electronic device 1, each electronic interference suppressor is stuck to an inner surface of the housing. However, the effect of this invention is derived from the positional relation among the interfering object, the interfered object, and the electromagnetic interference suppressor, and a support member on which an electronic interference suppressor is supported is therefore not always required to be a housing. For instance, a structure may be employed in which support posts are provided at four corners around the interfering object to support the electromagnetic interference suppressor by the support posts. In this structure, the electromagnetic interference suppressor may be supported in a place apart from the housing in some cases.

An electronic device 60 according to a second embodiment of this invention is described. The electromagnetic interference suppressor in the first embodiment described above is disposed along an inner surface of the housing. The housing in the first embodiment is an insulator in principle, but can be a conductor in an outer portion of the housing that corresponds to the electromagnetic interference suppressor. In contrast, an insulator covers at least one of an interfering object or an interfered object on a substrate in the second embodiment. Of the outer portion of the insulator covering the at least one of the interfering object or the interfered object, at least the top surface of the insulator is also covered with an electromagnetic interference suppressor. The description given in the first embodiment on the evaluation system 10 with reference to FIG. 3 to FIG. 16 applies to the second embodiment as well.

Figure 22:
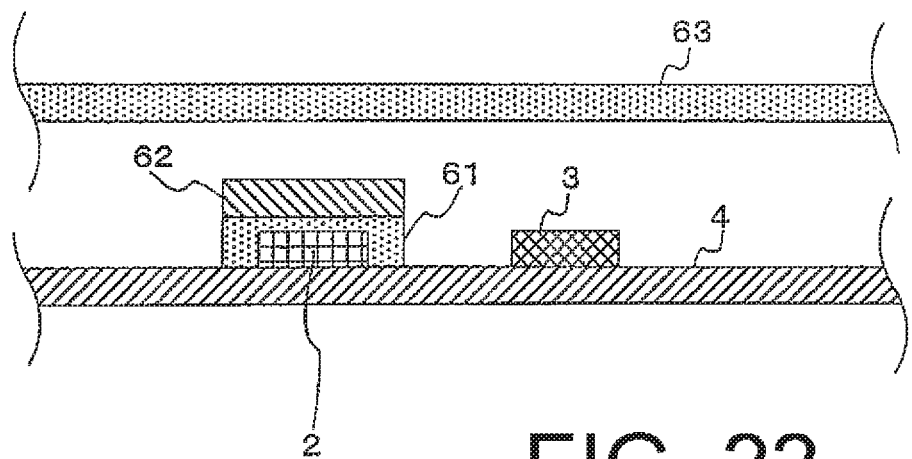
FIG. 22 is a schematic view for illustrating a partial cross section of an electronic device 60, in which the interfering object 2 disposed on a substrate 4 is covered with an insulator 61 and an electromagnetic interference suppressor 62 shaped like a plate is disposed on top of the insulator 61.

In the electronic device 60, the interfering object 2 disposed on the substrate 4 is covered with an insulator 61, and the electromagnetic interference suppressor 62 having a plate-like shape is disposed on top of the insulator 61 as illustrated in FIG. 22. The insulator 61 is, for example, a mold resin. The electromagnetic interference suppressor 62 covers the entire area above the top surface of the interfering object 2, which is covered with the insulator 61, but does not cover areas above the side surfaces of the interfering object 2. A housing 63 illustrated in FIG. 22 is a part of the electronic device 60. Only a portion of the housing 63 is illustrated in FIG. 22, and unillustrated portions of the housing 63 continue beyond wavy lines at the left and right end portions of FIG. 22. The housing 63 is not limited by a restriction dictating that the housing 63 be an insulator except in a portion in which the electromagnetic interference suppressor is disposed, and can be a housing made entirely of metal. This is because, with the insulator 61 covering the interfering object 2, the metal housing does not cause noise reflection.

Figure 23:
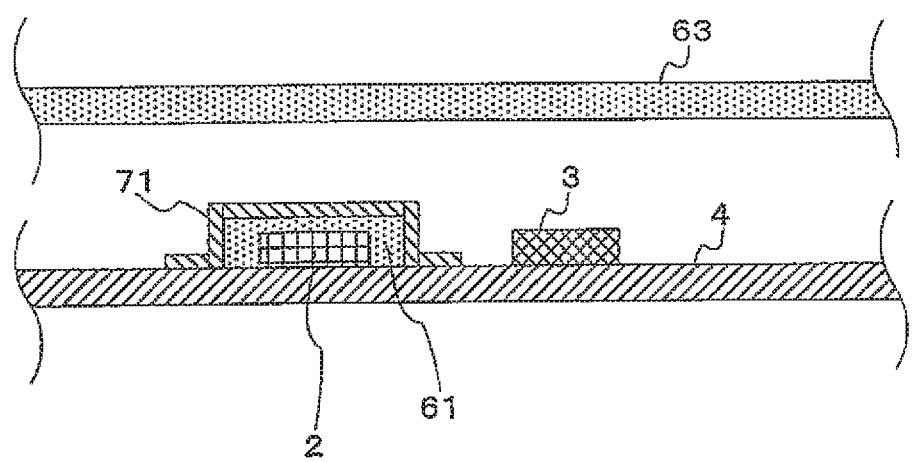
FIG. 23 is a schematic view for illustrating a partial cross section of an electronic device 70, in which the interfering object 2 disposed on the substrate 4 is covered with the insulator 61 and an electromagnetic interference suppressor 71 further covers the covered interfering object 2.

An electronic device 70, which is a modification of the electronic device 60, is the same as the electronic device 60 in that the interfering object 2 disposed on the substrate 4 is covered with the insulator 61 as illustrated in FIG. 23. The electromagnetic interference suppressor 62 in the electronic device 60 has a plate-like shape, and the electronic device 60 has a structure in which the electromagnetic interference suppressor 62 is mounted on the interfering object 2 with the insulator 61 interposed therebetween. In the electronic device 70, on the other hand, an electromagnetic interference suppressor 71 is a flexible sheet, covers the top surface and all side surfaces of the insulator 61, and further covers a surface of the substrate 4 that surrounds the insulator 61.

Figure 24:
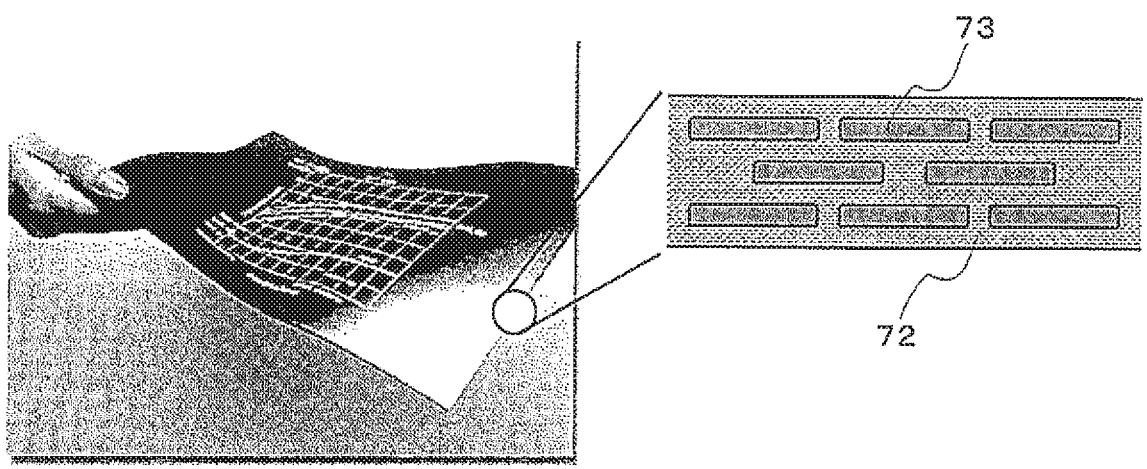
FIG. 24 is an illustration of an example of the electromagnetic interference suppressor 71, which has flexibility and is shaped like a sheet, and a schematic view of a cross section of the electromagnetic interference suppressor 71.

The electromagnetic interference suppressor 71 is created by, for example, distributing magnetic flat powder 73 in layers in a sheet made of resin 72 as illustrated in FIG. 24. The electromagnetic interference suppressor 71 can be used also as the electromagnetic interference suppressors 6, 13, and 21 in the first embodiment and the electromagnetic interference suppressor 62 of the electronic device 60. The electromagnetic interference suppressor illustrated in FIG. 24 is an example, and a configuration different from the electromagnetic interference suppressor 71 may be used.

Examples of the resin 72 include: elastomer rubbers, such as an acrylic rubber, chlorinated polyethylene, polybutadiene, polyisopropylene, EPM, EPDM, SBR, a nitrile rubber, epichlorohydrin, neoprene, butyl, polysulfide, and a urethane rubber; thermoplastic resins, such as polyethylene, polypropylene, polystyrene, acrylic, polyvinyl chloride, polycarbonate, nylon, urethane, PBT, PET, and ABS; and thermosetting resins, such as melamine, phenol, epoxy, urethane, polyimide, diallyl phthalate, unsaturated polyester, and furan. The magnetic flat powder 73 is flat-shaped soft-magnetic particles formed from, for example, an iron-based amorphous alloy.

The electronic device 70, in which the electromagnetic interference suppressor 71 covers not only the area above the top surface of the interfering object 2 but also areas above the side surfaces of the interfering object 2, is capable of suppressing noise effectively even when, for example, the interfering object 2 is tall.

While the electromagnetic interference suppressors 62 and 72 in the electronic devices 60 and 70 are each disposed on the insulator 61 or 62, which covers the interfering object 2, the interfered object 3, instead of the interfering object 2, may be covered with the insulator on which the electromagnetic interference suppressor is disposed.

The electronic devices 60 and 70 have a structure in which the interfering object 2 disposed on the substrate 4 is covered with the insulator 61 from above. The interfering object 2 may be covered, entirely except wiring and some other portions, with the insulator 61 in advance to be disposed on the substrate 4 later.

The electronic device 70 is structured so that the electromagnetic interference suppressor 71 covers the interfering object 2 covered with the insulator 61, together with a portion of the substrate 4 that surrounds the interfering object 2. The electronic device 70 may instead be structured so that the interfering object 2 covered with the insulator 61 is covered with the electromagnetic interference suppressor 71 in advance to be disposed on the substrate 4 later.

Modifications of the first embodiment can be combined with the second embodiment to suit individual cases, which is understood by the person skilled in the art. For instance, it is self-evident to the person skilled in the art that the interfering object 2 covered with the insulator 61 and with the electromagnetic interference suppressor 62 or 71 can be disposed on a substrate separate from a substrate on which the interfered object 3 is disposed as in the electronic device 50 of FIG. 21.

REFERENCE SIGNS LIST 1, 20, 30, 40, 50, 60, 70 electronic device
2 interfering object
3 interfered object
4, 4A, 4B substrate
5, 63 housing
6, 13, 21, 62, 71 electromagnetic interference suppressor
10 evaluation system
11, 12, 42 antenna
31 conductor plate
41 recess
61 insulator
72 resin
73 magnetic flat powder

The invention claimed is:
1. An electronic device comprising:
an interfering object configured to generate an electromagnetic wave;
an interfered object to be affected by the electromagnetic wave;

a substrate configured to mount thereon the interfering object and the interfered object; and an electromagnetic interference suppressor, which is disposed in parallel to the substrate, and is disposed along only one of the interfering object and the interfered object, wherein, when an end portion of the interfering object, which is opposed to the interfered object, is defined as a first end portion, and an end portion of the interfered object, which is opposed to the interfering object, is defined as a second end portion, one end portion of the electromagnetic interference suppressor is disposed between the first end portion and the second end portion.

2. The electronic device according to claim 1, further comprising an insulator, which is disposed in parallel to the substrate, and is disposed along another one of the interfering object and the interfered object.

3. The electronic device according to claim 2, further comprising a housing, which encloses both of the interfering object and the interfered object, wherein the housing includes the electromagnetic interference suppressor and the insulator.

4. The electronic device according to claim 1, further comprising a conductor plate, which, when one of the interfering object and the interfered object is disposed along one surface of the electromagnetic interference suppressor, is disposed along another surface of the electromagnetic interference suppressor.

5. The electronic device according to claim 1, wherein the interfering object and the interfered object are each any one of an electronic part, an electronic circuit, and wiring.

6. The electronic device according to claim 5, wherein the interfering object is a power supply line and the interfered object is a signal line.

7. The electronic device according to claim 1, further comprising a plurality of substrates including a first substrate and a second substrate, which are different from each other, wherein the interfering object is disposed on the first substrate and the interfered object is disposed on the second substrate.

8. A communication device comprising the electronic device of claim 1.

9. A method of disposing an electromagnetic interference suppressor in an electronic device, the electronic device including:

an interfering object configured to generate electromagnetic wave;

an interfered object to be affected by the electromagnetic wave;

a substrate configured to mount thereon the interfering object and the interfered object; and an electromagnetic interference suppressor, which is disposed in parallel to the substrate, and is disposed along only one of the interfering object and the interfered object, the method comprising disposing, when an end portion of the interfering object, which is opposed to the interfered object, is defined as a first end portion, and an end portion of the interfered object, which is opposed to the interfering object, is defined as a second end portion, one end portion of the electromagnetic interference suppressor between the first end portion and the second end portion.

10. An electronic device comprising:

an interfering object configured to generate an electromagnetic wave;

an interfered object to be affected by the electromagnetic wave;

a substrate configured to mount thereon the interfering object and the interfered object, the interfering object and the interfered object being separated from each other in a surface direction of the substrate when seen in plan view;

an insulator configured to partially or entirely cover one of the interfering object and the interfered object; and an electromagnetic interference suppressor disposed at a covered object formed of the insulator.

11. The electronic device according to claim 10, wherein the electromagnetic interference suppressor has a plate-like shape, and is disposed so that a surface of the covered object which is opposite to a surface that is in contact with the substrate, is covered.

12. The electronic device according to claim 10, wherein the electromagnetic interference suppressor has a sheet-like shape, and is disposed so that a surface of the covered object other than a surface that is in contact with the substrate, is covered.

* * * * *